US012557693B2

(12) United States Patent
Hirose

(10) Patent No.: US 12,557,693 B2
(45) Date of Patent: Feb. 17, 2026

(54) GLASS FOR COVERING SEMICONDUCTOR ELEMENT AND MATERIAL FOR COVERING SEMICONDUCTOR ELEMENT USING SAME

(71) Applicant: NIPPON ELECTRIC GLASS CO., LTD., Otsu (JP)

(72) Inventor: Masayuki Hirose, Otsu (JP)

(73) Assignee: NIPPON ELECTRIC GLASS CO., LTD., Otsu (JP)

( * ) Notice: Subject to any disclaimer, the term of this patent is extended or adjusted under 35 U.S.C. 154(b) by 1051 days.

(21) Appl. No.: 17/627,383

(22) PCT Filed: Sep. 10, 2020

(86) PCT No.: PCT/JP2020/034331
§ 371 (c)(1),
(2) Date: Jan. 14, 2022

(87) PCT Pub. No.: WO2021/060001
PCT Pub. Date: Apr. 1, 2021

(65) Prior Publication Data
US 2022/0319942 A1    Oct. 6, 2022

(30) Foreign Application Priority Data

Sep. 24, 2019 (JP) .................. 2019-172436

(51) Int. Cl.
*H01L 23/29* (2006.01)
*C03C 3/066* (2006.01)
*C03C 4/20* (2006.01)
*C03C 10/00* (2006.01)
*H01L 21/02* (2006.01)
*H01L 23/31* (2006.01)

(52) U.S. Cl.
CPC ............ *H01L 23/291* (2013.01); *C03C 3/066* (2013.01); *C03C 4/20* (2013.01); *C03C 10/00* (2013.01); *H01L 21/02112* (2013.01); *H01L 23/3171* (2013.01); *C03C 2214/20* (2013.01)

(58) Field of Classification Search
CPC ..... C03C 3/066; C03C 10/00; C03C 2214/20; C03C 3/093; C03C 8/04; H01L 21/02112; H01L 23/3171
See application file for complete search history.

(56) References Cited

U.S. PATENT DOCUMENTS

| 2008/0161178 A1 | 7/2008 | Besinger et al. |
| 2013/0075873 A1 | 3/2013 | Ogasawara et al. |
| 2013/0154064 A1 | 6/2013 | Ogasawara et al. |
| 2014/0312472 A1 | 10/2014 | Ogasawara et al. |
| 2014/0339685 A1 | 11/2014 | Muyari et al. |
| 2014/0361416 A1 | 12/2014 | Ogasawara et al. |
| 2014/0361446 A1 | 12/2014 | Ogasawara et al. |
| 2019/0055155 A1* | 2/2019 | Sridharan ............... C03C 3/072 |

FOREIGN PATENT DOCUMENTS

| CN | 109564904 A | 4/2019 |
| JP | S48-043275 A | 6/1973 |
| JP | S50-129181 A | 10/1975 |
| JP | H01-049653 B2 | 10/1989 |
| JP | 2008-162881 A | 7/2008 |
| TW | 201248687 A | 12/2012 |
| TW | 201811699 A | 4/2018 |
| WO | WO-2012-160704 A1 | 11/2012 |
| WO | WO-2013/168236 A1 | 11/2013 |
| WO | WO-2018-026402 A1 | 2/2018 |
| WO | WO-2020-071093 A1 | 4/2020 |
| WO | WO-2020-071094 A1 | 4/2020 |

OTHER PUBLICATIONS

Office Action issued Feb. 27, 2024 in Taiwanese Patent Application No. 109131576 (4 pages) with an English translation (3 pages).
International Search Report mailed Nov. 10, 2020 for PCT/JP2020/034331.
Written Opinion of the International Searching Authority mailed Nov. 10, 2020 for PCT/JP2020/034331.
Office Action issued Feb. 23, 2022 for counterpart Taiwanese Application No. 109131576.
First Chinese Office Action issued Mar. 30, 2024 in Application No. 202080066506.6.
Second Chinese Office Action issued Sep. 25, 2024 in Application No. 202080066506.6.
Chinese Office Action issued Jan. 15, 2025 in Application No. 202080066506.6.
Japanese Office Action issued Jul. 31, 2024 in Application No. 2021-548788.
Office Action issued May 25, 2022 in Taiwanese Patent Application No. 109131576 (4 pages) with an English translation (3 pages).

* cited by examiner

*Primary Examiner* — Cameron K Miller

(74) *Attorney, Agent, or Firm* — Faegre Drinker Biddle & Reath LLP

(57) ABSTRACT

The glass for covering a semiconductor element contains: in mol %, as a glass composition, $SiO_2$: 20% to 36%, ZnO: 8% to 40%, $B_2O_3$: 10% to 24%, $Al_2O_3$: 10% to 20%, and MgO+CaO: 8% to 22%, in which $SiO_2/ZnO$ is 0.6 or more and less than 3.3 in terms of a molar ratio, and a lead component is substantially not contained.

6 Claims, No Drawings

GLASS FOR COVERING SEMICONDUCTOR ELEMENT AND MATERIAL FOR COVERING SEMICONDUCTOR ELEMENT USING SAME

TECHNICAL FIELD

The present invention relates to a glass for covering a semiconductor element and a material for covering a semiconductor element using the same.

BACKGROUND ART

In semiconductor elements such as silicon diodes and transistors, the surface of the semiconductor element including a P-N junction is generally covered with a glass.

Accordingly, the surface of the semiconductor element can be stabilized and deterioration of characteristics over time can be prevented.

Examples of characteristics required for a glass for covering a semiconductor element include that: (1) a thermal expansion coefficient matches a thermal expansion coefficient of the semiconductor element such that cracks or the like do not occur due to a difference in thermal expansion coefficient from the semiconductor element; (2) covering may be performed at a low temperature (for example, 860° C. or lower) in order to prevent deterioration of the characteristics of the semiconductor element; and (3) impurities such as alkaline components that adversely influence the surface of the semiconductor element are not contained.

In the related art, as the glass for covering a semiconductor element, a zinc-based glass such as a $ZnO$—$B_2O_3$—$SiO_2$-based glass, and a lead-based glass such as a $PbO$—$SiO_2$—$Al_2O_3$-based glass and a $PbO$—$SiO_2$—$B_2O_3$—$Al_2O_3$-based glass are known. At present, a lead-based glass such as $PbO$—$SiO_2$—$Al_2O_3$-based glass and a $PbO$—$SiO_2$—$B_2O_3$—$Al_2O_3$-based glass is the mainstream from the viewpoint of workability (see, for example, Patent Literatures 1 to 4).

CITATION LIST

Patent Literature

Patent Literature 1: JP-A-S48-43275
Patent Literature 2: JP-A-S50-129181
Patent Literature 3: JP-A-H01-49653
Patent Literature 4: JP-A-2008-162881

SUMMARY OF INVENTION

Technical Problem

However, the lead component in the lead-based glass is a component harmful to the environment. Since the above zinc-based glass contains a small amount of lead component and bismuth component, it cannot be said that it is completely harmless to the environment.

In addition, the zinc-based glass has problems of being inferior in chemical durability to the lead-based glass and being easily eroded in an acid treatment step after forming a covering layer. Therefore, it is necessary to further form a protective film on the surface of the covering layer and carry out an acid treatment.

On the other hand, when a content of $SiO_2$ in a glass composition is increased, acid resistance is improved and a reverse voltage of the semiconductor element is improved. However, since a firing temperature of the glass rises, there is a risk that characteristics of the semiconductor element deteriorate in a covering step.

Therefore, the present invention has been made in view of the above circumstances, and an object thereof is to provide a glass for covering a semiconductor element having a low environmental load, excellent acid resistance, and a low firing temperature.

Solution to Problem

As a result of diligent consideration, the present inventors have found that when, in a $SiO_2$—$B_2O_3$—$Al_2O_3$—$ZnO$-based glass having a specific glass composition, a ratio of $SiO_2$ and $ZnO$ is regulated, and $MgO$ and/or $CaO$ is introduced in a predetermined amount, the above problems can be solved. Thus, the present invention has been proposed. That is, a glass for covering a semiconductor element according to the present invention contains: in mol %, as a glass composition, $SiO_2$: 20% to 36%, $ZnO$: 8% to 40%, $B_2O_3$: 10% to 24%, $Al_2O_3$: 10% to 20%, and $MgO+CaO$: 8% to 22%, in which $SiO_2/ZnO$ is 0.6 or more and less than 3.3 in terms of a molar ratio, and a lead component is substantially not contained. Here, "$MgO+CaO$" means a total content of $MgO$ and $CaO$, and "$SiO_2/ZnO$" means a value obtained by dividing the content of $SiO_2$ by the content of $ZnO$. In addition, " . . . is substantially not contained" means that the corresponding component is not intentionally added as a glass component, and does not mean that impurities that are inevitably mixed are completely eliminated. Specifically, it means that the content of the corresponding component including impurities is less than 0.1 mass %.

In the glass for covering a semiconductor element according to the present invention, the content range of each component is regulated as described above. Accordingly, the environmental load is small, the acid resistance is improved, and the firing temperature is easily lowered.

It is preferable that the glass for covering a semiconductor element according to the present invention further contains: in mol %, $CaO$: 8% to 22%.

It is preferable that a material for covering a semiconductor element according to the present invention contains: 75 mass % to 100 mass % of a glass powder made of the above glass for covering a semiconductor element; and 0 mass % to 25 mass % of a ceramic powder.

It is preferable that the material for covering a semiconductor element according to the present invention has a thermal expansion coefficient in a temperature range of 30° C. to 300° C. of $20 \times 10^{-7}$/° C. to $55 \times 10^{-7}$/° C. Here, the expression "thermal expansion coefficient in a temperature range of 30° C. to 300° C." refers to a value measured by a push rod type thermal expansion coefficient measuring device.

Advantageous Effects of Invention

According to the present invention, it is possible to provide a glass for covering a semiconductor element having a low environmental load, excellent acid resistance, and a low firing temperature.

DESCRIPTION OF EMBODIMENTS

The numerical range indicated by using "to" in the present description means a range including the numerical values before and after "to" as the minimum value and the maximum value, respectively.

A glass for covering a semiconductor element according to the present invention contains: in mol %, as a glass composition, $SiO_2$: 20% to 36%, ZnO: 8% to 40%, $B_2O_3$: 10% to 24%, $Al_2O_3$: 10% to 20%, and MgO+CaO: 8% to 22%, in which $SiO_2/ZnO$ is 0.6 or more and less than 3.3 in terms of a molar ratio, and a lead component is substantially not contained. The reason for limiting the content of each component as described above will be described below. In the following description of the content of each component, % indication means mol % unless otherwise specified.

$SiO_2$ is a network-forming component of a glass and is a component that enhances acid resistance. The content of $SiO_2$ is 20% to 36%, preferably 21% to 33%, and particularly preferably 22% to 30%. When the content of $SiO_2$ is too small, the acid resistance tends to decrease and vitrification is difficult. On the other hand, when the content of $SiO_2$ is too large, the firing temperature of the glass is increased, and the characteristics of the semiconductor element are likely to be deteriorated in a covering step.

ZnO is a component that stabilizes the glass. The content of ZnO is 8% to 40%, preferably 12% to 38%, and particularly preferably 14% to 32%. When the content of ZnO is too small, the devitrification property during melting is strong, and it is difficult to obtain a homogeneous glass. On the other hand, when content of ZnO is too large, the acid resistance tends to decrease.

$SiO_2/ZnO$ is 0.6 or more and less than 3.3, preferably 0.8 to 2.4, and particularly preferably 1 to 1.8. When $SiO_2/ZnO$ is too small, the glass tends to be phase-separated and the acid resistance tends to decrease. On the other hand, when $SiO_2/ZnO$ is too large, the firing temperature of the glass is increased, and the characteristics of the semiconductor element are likely to be deteriorated in the covering step.

$B_2O_3$ is a network-forming component of the glass and is a component that enhances softening fluidity. The content of $B_2O_3$ is 10% to 24%, preferably 11% to 22%, and particularly preferably 12% to 20%. When the content of $B_2O_3$ is too small, the crystallinity is increased, so that the softening fluidity is impaired during covering, and it is difficult to uniformly cover the surface of the semiconductor element. On the other hand, when the content of $B_2O_3$ is too large, the acid resistance tends to decrease.

$Al_2O_3$ is a component that stabilizes the glass. The content of $Al_2O_3$ is 10% to 20%, preferably 11% to 19%, and particularly preferably 12% to 18%. When the content of $Al_2O_3$ is too small, vitrification is difficult. On the other hand, when the content of $Al_2O_3$ is too large, the firing temperature of the glass is increased, and the characteristics of the semiconductor element are likely to be deteriorated in the covering step.

MgO and CaO are components that reduce the viscosity of glass. When a predetermined amount of MgO and/or CaO is contained, low-temperature firing is possible even when a large amount of $SiO_2$ is contained. MgO+CaO is 8% to 22%, preferably 9% to 21%, and particularly preferably 10% to 20%. When MgO+CaO is too small, the softening temperature of glass tends to rise. On the other hand, when MgO+CaO is too large, the thermal expansion coefficient tends to be too high and the insulation tends to decrease.

The preferred ranges of the contents of MgO and CaO are as follows.

The content of MgO is 0% to 22%, preferably 4% to 22%, 8% to 22%, 9% to 21%, and particularly preferably 10% to 20%.

The content of CaO is 0% to 22%, preferably 4% to 22%, 8% to 22%, 9% to 21%, and particularly preferably 10% to 20%.

In addition to the above components, other components (for example, SrO, BaO, $MnO_2$, $Bi_2O_3$, $Ta_2O_5$, $Nb_2O_5$, $CeO_2$, and $Sb_2O_3$) may be contained up to 7% (preferably up to 3%).

From the viewpoint of environmental aspect, it is preferable that the lead component (for example, PbO) is substantially not contained and F and Cl are not substantially contained. In addition, it is preferable that alkali metal components (for example, $Li_2O$, $Na_2O$ and $K_2O$) that adversely influence the surface of the semiconductor element are not substantially contained.

The glass for covering a semiconductor element according to the present invention is preferably in the form of powder, that is, a glass powder. If the glass is processed into a glass powder, the surface of the semiconductor element can be easily covered by using, for example, a paste method, an electrophoresis coating method, or the like.

The average particle size $D_{50}$ of the glass powder is preferably 25 μm or less, and particularly preferably 15 μm or less. When the average particle size $D_{50}$ of the glass powder is too large, it is difficult to make a paste. In addition, it is difficult to coat the paste by using the electrophoresis method. The lower limit of the average particle size $D_{50}$ of the glass powder is not particularly limited, and in reality, is preferably 0.1 μm or more. The "average particle size $D_{50}$" is a value measured on a volume basis and refers to a value measured by a laser diffraction method.

The glass for covering a semiconductor element according to the present invention can be obtained by, for example, blending raw material powders of oxide components into a batch, melting the batch at about 1500° C. for about 1 hour to vitrify, and then performing forming (thereafter, crushing and classifying as necessary).

A material for covering a semiconductor element according to the present invention contains a glass powder made of the above glass for covering a semiconductor element, and the glass powder may be mixed with a ceramic powder (for example, cordierite powder) to form a composite powder, if necessary. The addition of the ceramic powder makes it easier to adjust the thermal expansion coefficient.

It is preferable that the material for covering a semiconductor element according to the present invention contains: 75 mass % to 100 mass % of a glass powder made of the above glass for covering a semiconductor element; and 0 mass % to 25 mass % of a ceramic powder.

The ceramic powder is preferably less than 25 parts by mass, and particularly less than 20 parts by mass, with respect to 100 parts by mass of the glass powder. When the content of the ceramic powder is too large, the softening fluidity of the glass is impaired, making it difficult to cover the surface of the semiconductor element.

The average particle size $D_{50}$ of the ceramic powder is preferably 30 μm or less, and particularly preferably 20 μm or less. When the average particle size $D_{50}$ of the ceramic powder is too large, the surface smoothness of a covering layer tends to decrease. The lower limit of the average particle size $D_{50}$ of the ceramic powder is not particularly limited, and in reality, is 0.1 μm or more.

In the material for covering a semiconductor element according to the present invention, the thermal expansion coefficient in a temperature range of 30° C. to 300° C. is preferably $20 \times 10^{-7}/°C.$ to $55 \times 10^{-7}/°C.$, and particularly preferably $30 \times 10^{-7}/°C.$ to $50 \times 10^{-7}/°C.$ When the thermal expansion coefficient is out of the above range, cracks, warpage, etc. due to the difference in thermal expansion coefficient from the semiconductor element are likely to occur.

In the material for covering a semiconductor element according to the present invention, the firing temperature in forming the covering layer is preferably 900° C. or lower, and particularly preferably 880° C. or lower. When the firing temperature is too high, the semiconductor element is likely to deteriorate.

EXAMPLES

Hereinafter, the present invention will be described in detail based on Examples. The following Examples are merely examples. The present invention is not limited to the following Examples.

Table 1 shows Examples (Samples Nos. 1 to 4) and Comparative Examples (Samples Nos. 5 to 8) of the present invention.

TABLE 1

| Glass powder (mol %) | No. 1 | No. 2 | No. 3 | No. 4 | No. 5 | No. 6 | No. 7 | No. 8 |
|---|---|---|---|---|---|---|---|---|
| $SiO_2$ | 32 | 30 | 22 | 27 | 15 | 44 | 25 | 23 |
| ZnO | 11 | 20 | 28 | 24 | 35 | 20 | 25 | 45 |
| $B_2O_3$ | 22 | 18 | 18 | 16 | 15 | 9 | 26 | 7 |
| $Al_2O_3$ | 17 | 15 | 15 | 14 | 18 | 15 | 11 | 11 |
| MgO | 0 | 17 | 17 | 19 | 17 | 12 | 13 | 13 |
| CaO | 18 | 0 | 0 | 0 | 0 | 0 | 0 | 0 |
| MgO + CaO | 18 | 17 | 17 | 19 | 17 | 12 | 13 | 13 |
| $SiO_2$/ZnO | 2.91 | 1.50 | 0.79 | 1.13 | 0.43 | 2.20 | 1.00 | 0.51 |
| Ceramic powder (mass %) | Cordierite powder 10 | No | No | No | No | No | No | No |
| Thermal expansion coefficient ($\times 10^{-7}$/° C.) | 39 | 42 | 43 | 43 | Phase separation | 39 | 42 | 51 |
| Softening point (° C.) | 830 | 810 | 800 | 800 | | 920 | 770 | 770 |
| Firing temperature (° C.) | 850 | 830 | 820 | 820 | | 940 | 790 | 790 |
| Acid resistance | A | A | A | A | | A | B | B |

Each sample was prepared as follows. First, raw material powders were mixed so as to have the glass composition shown in Table 1 to form a batch, and the batch was melted at 1500° C. for 1 hour to vitrify. Subsequently, the molten glass was formed into a film, crushed with a ball mill, and classified using a 350 mesh sieve to give a glass powder having an average particle size $D_{50}$ of 12 μm. In Sample No. 1, the amount of cordierite powder (average particle size $D_{50}$: 12 μm) shown in Table 1 was added to the resulting glass powder to prepare a composite powder.

For each sample, the thermal expansion coefficient, the softening point, and the acid resistance were evaluated. The results are shown in Table 1.

The thermal expansion coefficient is a value measured in a temperature range of 30° C. to 300° C. using a push rod type thermal expansion coefficient measuring device.

The softening point was measured using a macro-type differential thermal analyzer.

Specifically, in a chart obtained by measuring each glass powder sample using the macro-type differential thermal analyzer, the value of the fourth inflection point was defined as the softening point.

The acid resistance was evaluated as follows. Each sample was press-molded to a size of about 20 mm in diameter and about 4 mm in thickness, and then a pellet-shaped sample was prepared by firing at the firing temperature shown in Table 1. The mass change per unit area was calculated from the mass loss after immersing this sample in 30% nitric acid at 25° C. for 1 minute, and used as an index of acid resistance. A mass change per unit area of less than 1.0 mg/cm² was evaluated as "A", and a mass change per unit area of 1.0 mg/cm² or more was evaluated as "B". The firing temperature was the softening point+20° C.

As seen from Table 1, in Sample Nos. 1 to 4, the thermal expansion coefficient was $39 \times 10^{-7}$/° C. to $43 \times 10^{-7}$/° C., the firing temperature was 820° C. to 850° C., and the evaluation for the acid resistance was also good. Therefore, the Sample Nos. 1 to 4 are considered to be suitable for covering a semiconductor element.

On the other hand, in Sample No. 5, the phase separation was strong and no vitrification was observed. In Sample No. 6, the firing temperature was high. In Sample Nos. 7 and 8, the acid resistance was inferior.

The invention claimed is:

1. A glass for covering a semiconductor element comprising: in mol %, as a glass composition, $SiO_2$: 20% to 36%, ZnO: 8% to 40%, $B_2O_3$: 11% to 24%, $Al_2O_3$: 10% to 20%, MgO+CaO: 8% to 22%, and $Bi_2O_3$: 0 to 3%, wherein $SiO_2$/ZnO is 0.6 or more and less than 3.3 in terms of a molar ratio, and a lead component is substantially not contained.

2. The glass for covering a semiconductor element according to claim 1, further comprising: in mol %, CaO: 8% to 22%.

3. A material for covering a semiconductor element comprising: 75 mass % to 100 mass % of a glass powder made of the glass for covering a semiconductor element according to claim 1; and 0 mass % to 25 mass % of a ceramic powder.

4. The material for covering a semiconductor element according to claim 3, wherein a thermal expansion coefficient in a temperature range of 30° C. to 300° C. is $20 \times 10^{-7}$/° C. to $55 \times 10^{-7}$/° C.

5. A material for covering a semiconductor element comprising: 75 mass % to 100 mass % of a glass powder made of the glass for covering a semiconductor element according to claim 2; and 0 mass % to 25 mass % of a ceramic powder.

6. The material for covering a semiconductor element according to claim 5, wherein a thermal expansion coefficient in a temperature range of 30° C. to 300° C. is $20×10^{-7}/°$ C. to $55×10^{-7}/°$ C.

\* \* \* \* \*